United States Patent
Chang et al.

(10) Patent No.: US 7,227,268 B2
(45) Date of Patent: Jun. 5, 2007

(54) PLACEMENT OF SACRIFICIAL SOLDER BALLS UNDERNEATH THE PBGA SUBSTRATE

(75) Inventors: Chi Shih Chang, Austin, TX (US); William T. Chen, Endicott, NY (US); Ajit Trivedi, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/977,263

(22) Filed: Oct. 29, 2004

(65) Prior Publication Data
US 2005/0063165 A1    Mar. 24, 2005

Related U.S. Application Data

(63) Continuation of application No. 08/912,429, filed on Aug. 18, 1997, now Pat. No. 6,829,149.

(51) Int. Cl.
*H01L 23/48* (2006.01)
*H01L 23/52* (2006.01)
*H01L 29/40* (2006.01)

(52) U.S. Cl. ............... 257/786; 257/738; 257/778; 257/E23.02; 257/E23.021; 257/E23.023; 257/E23.069; 438/108; 438/109

(58) Field of Classification Search ............ None
See application file for complete search history.

(56) References Cited

U.S. PATENT DOCUMENTS 4,990,996 A * 2/1991 Kumar et al. ............ 257/786
5,598,036 A * 1/1997 Ho ............................. 257/738

\* cited by examiner

*Primary Examiner*—Minhloan Tran
*Assistant Examiner*—Leslie Pilar Cruz
(74) *Attorney, Agent, or Firm*—Blakely, Sokoloff, Taylor & Zafman LLP

(57) ABSTRACT

The present invention discloses techniques that improve the reliability of a flip packages that uses underfill encapsulation. One embodiment of the present invention describes a method and apparatus of packaging a flip chip by relocating the neutral plane of the package substrate away from its mid-plane. Another embodiment of the present invention describes a method and apparatus of arranging the layers of a laminate for use in PBGA packaging that arranges the layers of the laminate according to the stiffness of each layer. Another embodiment of the present invention describes a method and apparatus of packaging a flip chip that uses one or more redundant interconnections at the bottom of the package substrate where the redundant interconnections are within the shadow of the IC chip.

16 Claims, 6 Drawing Sheets

PLACEMENT OF SACRIFICIAL SOLDER BALLS UNDERNEATH THE PBGA SUBSTRATE

CROSS-REFERENCES TO RELATED APPLICATIONS

This is a continuation of U.S. patent application Ser. No. 08/912,429, filed Aug. 18, 1997 now U.S. Pat. No. 6,829, 149. This continuation application claims the benefit of the U.S. patent application Ser. No. 08/9 12,429.

BACKGROUND OF THE INVENTION

1. Field of the Invention

The present invention relates to packaging semiconductor devices. More specifically, this invention relates to packaging semiconductor devices with laminar substrates using the flip chip packaging technique.

2. Description of the Related Art

The drive to higher semiconductor device densities requires that the packaging of a device or chip support these new densities. One technique that supports the increased device densities is the shift from peripheral wire bonding to area array chip interconnects. Area array chip interconnects use bumps or solder joints that directly couples the semiconductor chip to the package substrate. This technique accommodates the increased I/O pad counts and brings current to the interior of the chip, which improves the voltage noise margins. One type of area array interconnect packaging technique is the flip chip (FC) solder interconnect on a substrate. In the flip chip assembly or package, the semiconductor device or integrated circuit (IC) chip typically has bumps for soldering (FC solder joints) manufactured on the I/O pads of the chip (the top or etched side of the IC chip), which takes the place of the wire bonding pads. The chip is then turned upside down or "flipped" so that the device side or face of the IC chip couples to a substrate such as found in a plastic ball-grid-array (PBGA) substrate (or laminate).

One problem associated with the flip chip packaging technique occurs because of the large differences or mismatch between the coefficient of thermal expansion (CTE) of silicon (the IC chip) and the CTE of the PBGA substrate. The CTE of silicon is about 3 ppm per degree Centigrade and that of the PBGA substrate is about 17 ppm per degree Centigrade. The large difference in CTE causes the solder joints between the IC chip and the PBGA substrate to undergo shear stress during temperature changes, which can occur during the regular manufacturing process or even during the daily use of the package when used in a product. This repetitive heating up and cooling down of the package can cause reliability problems in a flip chip package that may cause it to fail prematurely and or suffer degraded performance.

One technique used to transfer some of the shear stress away from the FC solder joints is to use an encapsulant as an underfill material between the device side of the IC chip and the top surface of the PBGA substrate. After the encapsulant cures, the bonding of the encapsulant shifts most of the shear stress away from the solder joints and redistributes the stress across the IC chip, the substrate, and the encapsulant as a whole (also known as the package, the assembly, or the encapsulated flip chip package). Although the use of an encapsulant reduces some problems, its use creates new problems. One problem created when using an encapsulant is warpage. Warpage occurs because of the mismatches of the CTE of the IC chip and the CTE of the PBGA laminate. When the encapsulant cures, the substrate and the chip are initially flat. After the encapsulated FC PBGA cools down (to room temperature), the substrate will shrink more than the IC chip and cause the back side of the IC chip to be higher in the center (bulge up) and lower at the corners. This warpage in the assembled flip chip package causes compression stresses on the device side of the IC chip and tensile stresses on the back side of the IC chip. An excessive tensile stress may cause the IC chip to crack, and an excessive stress on the flip chip package may cause interfacial delamination between the IC chip and the encapsulant and or between the encapsulant and the substrate.

The present invention is a collection of techniques that overcome the above disadvantages and improve the overall reliability of the flip chip packaging technique. One may practice the different techniques of the present invention separately or in combination with one another. The present invention will reduce the probability of an IC chip crack due to excessive stresses (this also includes reducing the probability of stress enhanced electromigration of the metal lines on an IC chip) that includes warpage. Additionally, the present invention will reduce the probability of an interfacial delamination between the IC chip and the encapsulant and or between the encapsulant and the substrate. And, the present invention will also improve the reliability of the flip chip packaging technique in its daily use under repetitive thermal cycles of normal use when used as part of a product.

The present invention discloses one embodiment that relocates the neutral plane in a PBGA laminate. This embodiment of the present invention reduces the compression stress on the device side of the IC chip and reduces the tensile stress on the back side of the IC chip that occurs when the encapsulated flip chip package cools from its wiring board assembly temperature to room temperature.

Another embodiment of the present invention controls the stiffness of individual layers within the PBGA laminate with a gradual reduction of stiffness from the bottom side to the top side of the laminate. This embodiment reduces warpage and the shear stress on the IC chip solder joints.

Another embodiment of the present invention uses redundant solder joint connections between the encapsulated flip chip package and the printed wiring board. These additional solder joint connections help reduce the bending of the IC chip and help improve the placement of any heat sink on the back side of the IC chip. Reducing the bending of the IC chip also helps improve its thermal performance with a heatsink. The thermal performance is especially important when using high power IC chips that require a high capacity heat sink.

SUMMARY OF THE INVENTION

The present invention discloses a collection of techniques that improve the reliability of a flip chip (FC) plastic ball grid array (PBGA) assembly. One may practice the different techniques of the present invention separately or in combination with one another. The present invention reduces cracking of the IC chip due to excessive stresses such as warpage. Additionally, the present invention reduces the interfacial delamination between the IC chip and the encapsulant and or between the encapsulant and the substrate. And, the present invention improves the reliability of the flip chip packaging technique under repetitive thermal cycles of normal use.

One embodiment of the present invention describes a method and apparatus of packaging a flip chip by relocating the neutral plane of the PBGA substrate away from its mid-plane. One technique to relocate the neutral plane is to relocate the neutral plane during the fabrication of the structure.

Another embodiment of the present invention describes a method and apparatus of arranging the layers of a laminate for use in flip chip packaging that arranges the layers of the laminate according to the stiffness of each layer. The present invention arranges the layers in the laminate from the top to the bottom of the laminate where the least stiff layer is at the top of the laminate and the most stiff layer is at the bottom of the laminate. One technique to vary the stiffness of the metal layers is to vary the diameter of the via holes that go through the metal layer.

Another embodiment of the present invention describes a method and apparatus of packaging a flip chip assembly that uses one or more redundant interconnections between the PBGA substrate and the printed wiring board The redundant interconnections are at the bottom of the package substrate and are within the shadow of the IC chip. The present invention routes all signal paths and some of the power and ground connections to areas on the bottom of the package substrate that are outside the shadow of the IC chip with non-critical redundant power and ground connections routed to the area within the shadow of the IC chip.

DETAILED DESCRIPTION OF THE INVENTION

The present invention discloses methods and apparatuses that improve the reliability of a flip chip plastic ball grid array package that uses underfill encapsulation to help couple an integrated circuit chip to the plastic ball grid array laminate. This disclosure describes numerous specific details that includes specific materials, structures, and processes in order to provide a thorough understanding of the present invention. For example, this disclosure describes the present invention in terms of a flip chip packaging technique. One skilled in the art, however, will appreciate that one may practice the present invention without these specific details. And finally, this disclosure does not describe some well known processes, specific materials, and semiconductor structures in detail in order not to obscure the present invention.

Figure 1:
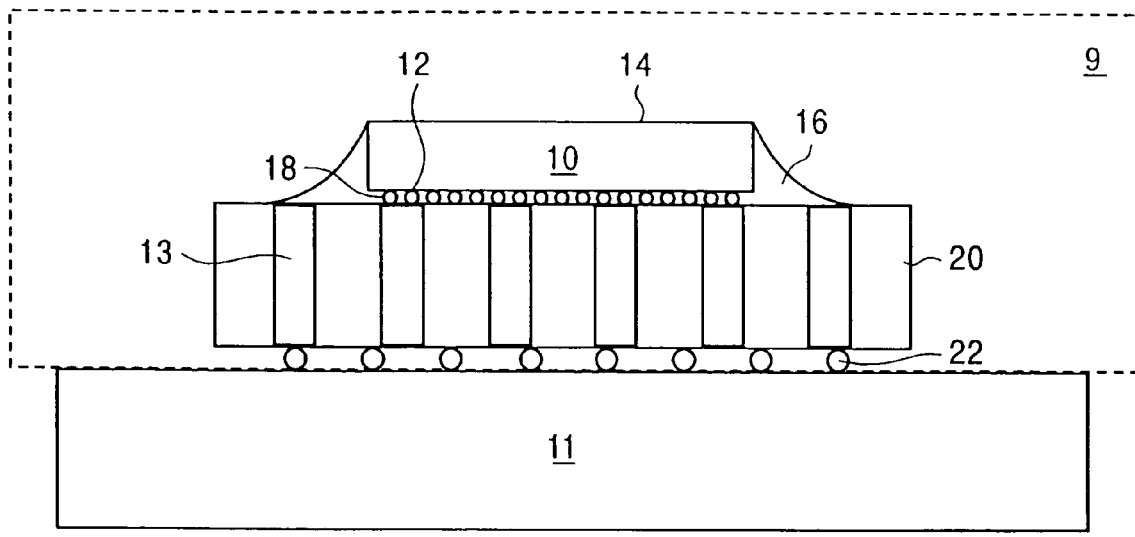
FIG. 1 illustrates a flip chip packaging technique.

A brief review of the current practice of flip chip (FC) assembly with plastic ball grid array packaging will help illustrate the advantages of the present invention. FIG. 1 illustrates a typical flip chip PBGA assembly 9 that comprises a semiconductor device or an integrated circuit (IC) chip 10 coupled to a PBGA substrate or laminate 20 through the IC solder joints or bumps 18. An encapsulant 16 couples the IC chip 10 to the laminate 20. The flip chip process "flips" the IC chip upside down so that the device side or face side of the IC chip is the side coupled to the PBGA laminate. For purposes of this disclosure, therefore, the bottom of the IC chip 12 is the device side of the IC chip and the top of the IC chip 14 is back side of the IC chip. The flip chip typically has bumps for soldering (IC solder joints) 18 manufactured on the I/O pads of the IC device. The IC solder joints take the place of the bonding wires used in non-flip chip packaging.

The PBGA laminate 20 couples to the printed wiring board (PWB) 11 through the PBGA solder joints 22. The plated through holes (PTH) 13 connect the signals from the IC chip 10 through the laminate 20 on to PWB 11. The electrical signal path is from IC chip 10 through IC solder joints 18 through substrate 20 by way of the PTHs 13. From the PTHs, the signals go through the PBGA solder joints 22 to PWB 11.

Figure 2:
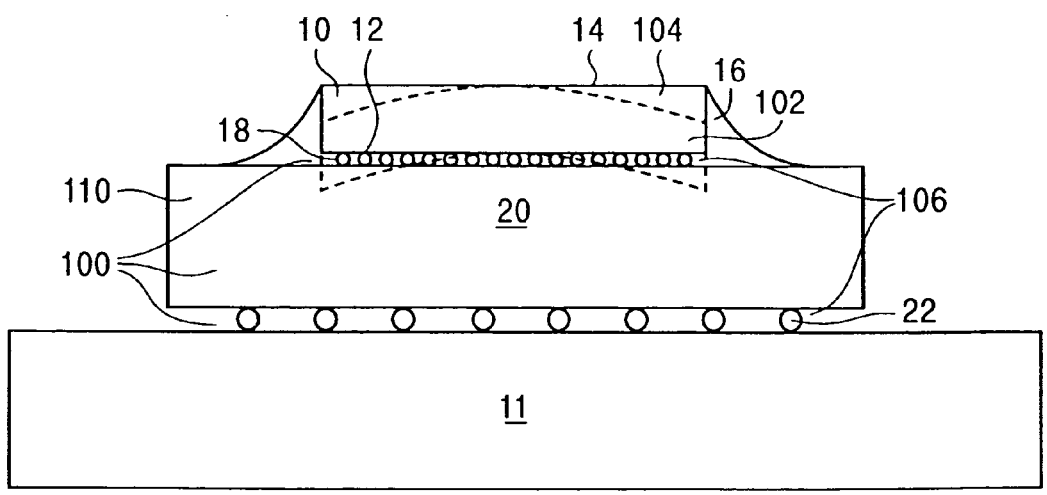
FIG. 2 illustrates common reliability problems associated with the flip chip packaging technique.

FIG. 2 illustrates common reliability problems associated with the flip chip packaging technique. Delamination 100 is a separation of layers and it can occur at various interfaces including the interface between the IC chip 10 and IC solder joints 18, the IC solder joints 18 and the substrate 20, the substrate 20 and the PBGA solder joints 22, and the PBGA solder joints 22 and the PWB 11. Warpage 102 is an out of plane displacement and is a manifestation of the mismatches of the coefficient of thermal expansion (CTE) of the IC chip and the CTE of the PBGA laminate. After the encapsulant 16 cures and subsequently cools down to room temperature, the PBGA laminate 20 shrinks more than the IC chip 10 and causes the back side 14 of the IC chip to be higher in the center (bulge up) and lower at the corners. Since silicon is basically a brittle material, chip cracking 104 may occur because of excessive stresses placed on the IC chip 10 such as from warpage. The warpage in the assembled flip chip package causes compression stress on the device side 12 of the IC chip 10 and tensile stress on the back side 14 of the IC chip. And, warpage can also cause solder strain 106 to occur because of the tensile or compression forces placed on the solder joints such as the IC joints 18.

Relocating the Neutral Planes

Figure 3:
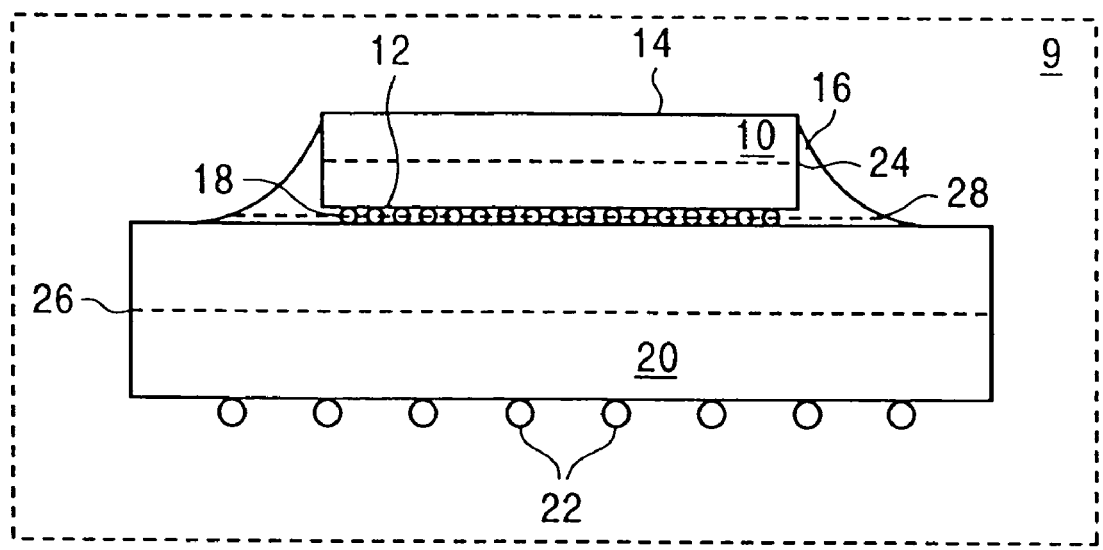
FIG. 3 illustrates the current practice for locating the neutral planes within a flip chip package.

FIG. 3 illustrates the current practice for locating the neutral planes within a flip chip package assembly. When bonding an IC chip 10 to a PBGA substrate 20 with an encapsulant 16, a flip chip package assembly 9 (IC chip, encapsulant, and PBGA substrate) will bend or warp toward the high CTE side. Warpage (102 of FIG. 2), as previously discussed, occurs because of the mismatches of the CTE of the IC chip 10 and the CTE of the PBGA laminate 20. After the encapsulant 16 cures and subsequently cools down to room temperature, the substrate 20 shrinks more than the IC chip 10 and causes the back side of the IC chip 10 to be higher in the center (bulge up) and lower at the corners. The warpage in the assembled flip chip package causes compression stress on the device side 12 and tensile stress on the back side 14 of the IC chip 10. An excessive tensile stress may cause the IC chip to crack, and an excessive stress on the flip chip package assembly 9 may cause interfacial delamination between the IC chip 10 and the encapsulant 16 and or between the encapsulant 16 and the substrate 20.

By itself, a typical IC chip 10 has a neutral plane 24 at the middle of the chip thickness (its mid-plane). A neutral plane is the plane within a structure where the stress is neutral, while the mid-plane of a structure is the plane that is half way between the top and the bottom of the structure. Additionally, a typical PBGA laminate or substrate 20 has a neutral plane 26 at the middle of the laminate (or its mid-plane). During the cooling down of the flip chip package assembly 9 after encapsulation, we may approximate that the neutral plane 24 of the IC chip 10 will shrink at a coefficient of thermal expansion (CTE) of 3 ppm per degree Centigrade, and the neutral plane 26 of the laminate 20 will shrink at a CTE of 17 ppm per degree Centigrade. And, the neutral plane 28 of the encapsulant 16 will shrink at an "equivalent" CTE that is somewhere between 3 and 17 ppm per degree Centigrade.

It is possible to calculate or simulate with some degree of precision the degree of bending of the IC chip 10 and the PBGA substrate 20 and the amount of shift from shear stress to bending stress by knowing the modulus and CTE of the IC chip, the cured encapsulant, and the PBGA laminate. These calculations are cumbersome and computationally intensive. However, one can approximate this analysis by using a geometric analysis to estimate the above stresses.

Figure 4:
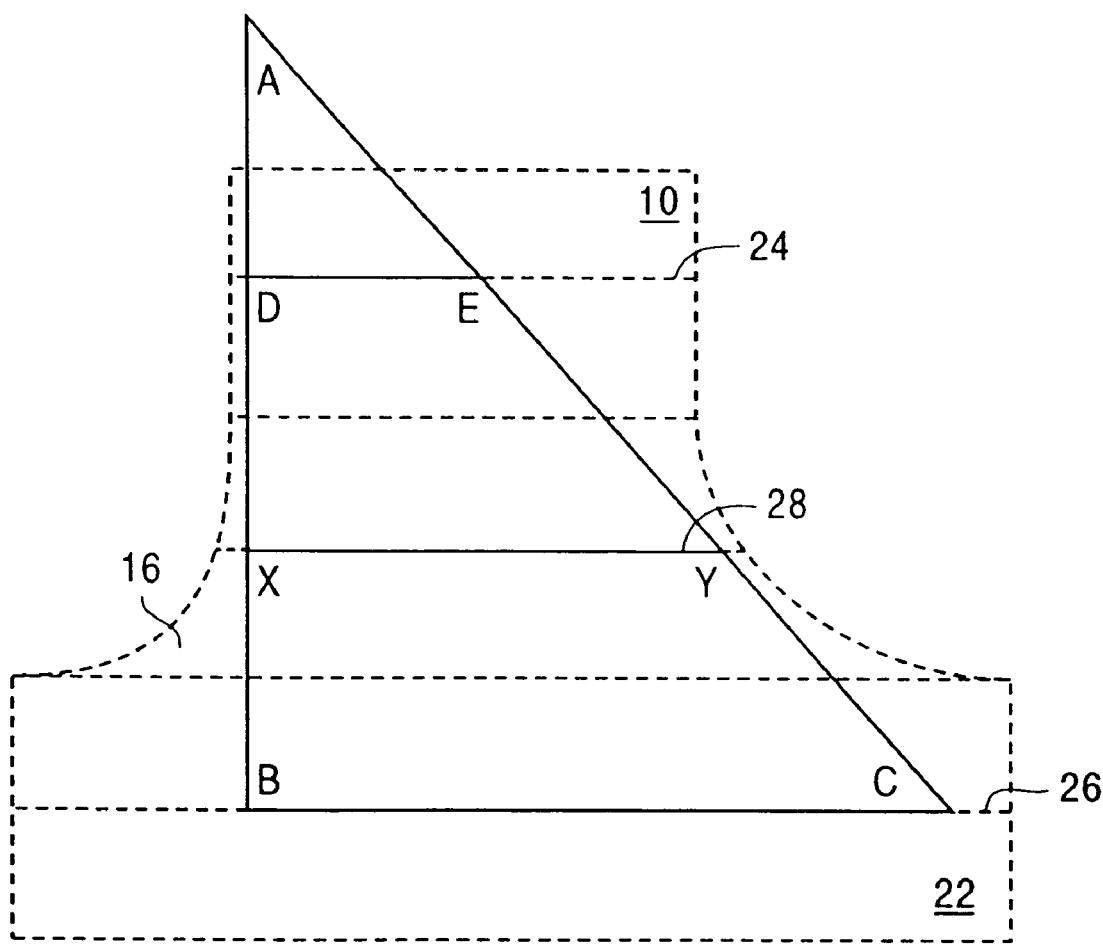
FIG. 4 illustrates a geometric technique for approximating the effective CTE at the neutral plane of the encapsulant within a flip chip package.

FIG. 4 illustrates a geometric estimation for approximating the effective CTE at the neutral plane of the encapsulant within a flip chip package assembly. As part of this estimation, one needs to assume that the modulus of the encapsulant is much smaller than those of the IC chip 10 and the PBGA laminate 20, and that the tensile and shear module of the IC chip and the laminate substrate are the same.

From above, one knows that the CTE of the laminate 20 (and it's neutral plane 26) is 17 ppm per degree Centigrade, and CTE of the IC chip 10 (and it's neutral plane 24) is 3 ppm per degree Centigrade. The line segment DE corresponds to the CTE of the IC chip's neutral plane 24. The line segment BC corresponds to the laminate's neutral plane 26. And, the mid-plane 28 of the encapsulant 16 corresponds to the line segment XY. One can calculate the "equivalent" CTE of the mid-plane 28 of the encapsulant 16 by knowing the distance from the neutral plane of the encapsulant (which here is its mid-plane) to the neutral planes of the chip and the PBGA laminate. If the distances are equal, the "equivalent" CTE will be 10 ppm per degree Centigrade.

For example, if the distance between the laminate's neutral plane 26 and the mid-plane 28 of the encapsulant is $14 \times 10^{-3}$ inches or 14 mils (line segment BX) and the distance between the neutral plane 24 of the silicon IC chip is also 14 mils (line segment DX), from geometry this relationship yields:

$XY(CTE$ encapsulant mid-plane$)=(BC*DX+DE*BX)/(BX+DX)$, or $XY=(17 \times 14+3 \times 14)/(14+14)=10$ ppm per degree Centigrade This shows that the approximate CTE of the encapsulant is 10 ppm per degree Centigrade. As defined earlier, warpage occurs because of the mismatch of the CTE of the laminate to the CTE of the IC chip. However, if one positions the location of the laminate's neutral plane 26 away from the encapsulant 16, one can reduce the CTE of the neutral plane 28 of the encapsulant.

Figure 5:
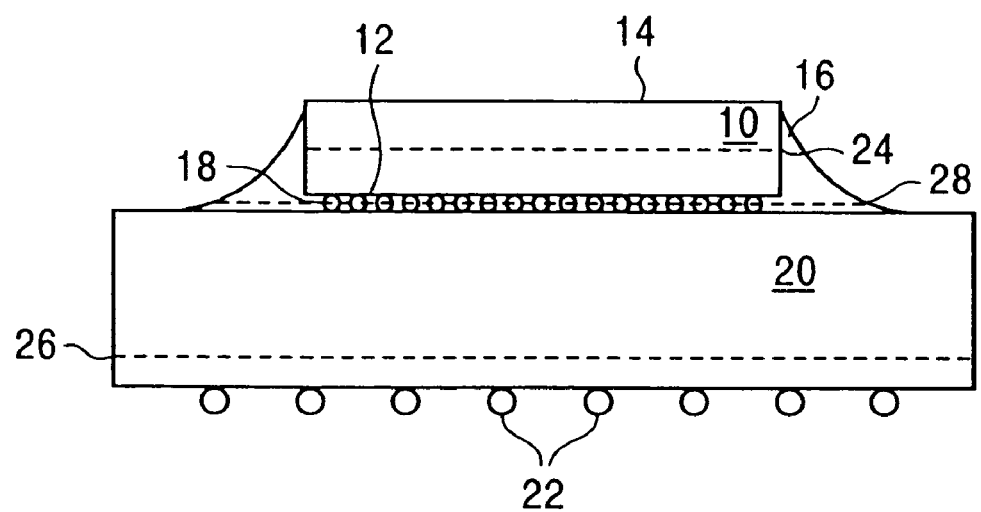
FIG. 5 illustrates an embodiment of the present invention that relocates the neutral plane of a substrate.

FIG. 5 illustrates an embodiment of the present invention that relocates the neutral plane of a substrate. Relocating the neutral plane of the substrate will reduce the compression strain on the device side of the IC chip and reduce the tensile strain on the back side of the IC chip that occur when the encapsulated flip chip package cools from its wiring board assembly temperature to room temperature. The following example illustrates the reduced stresses produced by the present invention: if the distance of the IC chip's neutral plane 24 (DE of FIG. 4) is 8 mils from the mid-plane 28 of the encapsulant and the laminate's neutral plane 26 (BC of FIG. 4) is 20 mils from the mid-plane 28 of the encapsulant, using the geometrical model illustrated in FIG. 4 yields:

$XY=(17 \times 8+3 \times 20)/(8+20)=7$ ppm per degree Centigrade

Therefore, the "equivalent" CTE at the neutral plane 28 of the encapsulant is now 7 ppm per degree Centigrade.

At the device side of bottom 12 of the IC chip 10, the "equivalent" CTE at the interface between the IC chip 10 and the encapsulant 16 will be between 3 and 7, and probably around 6.5 ppm per degree Centigrade. This "equivalent" is 3.5 ppm greater than the 3 ppm for the IC chip, instead of 6 ppm greater when the two neutral planes were at an equal distance from the mid-plane 28 of the encapsulant. This represents a 42% reduction in the compression strain on the device side of the IC chip.

The preferred embodiment of the present invention for relocating the neutral planes has the location of the neutral plane of the substrate moved during the fabrication of the laminate. One such technique for relocating the neutral plane is by controlling the stiffness of the PBGA substrate, as described below.

Controlling the Stiffness of the PBGA Substrate

Another embodiment of the present invention that improves the reliability of a flip chip assembly is the control or alteration of the stiffness of the individual layers within a PBGA laminate. The typical practice in manufacturing the separate layers of a PBGA substrate (including both metal and dielectric layers) is to make each layer with the same relative stiffness as the other similar layers. That is each dielectric layer has the same relative stiffness as the other dielectric layers, and each metal layer has the same relative stiffness as the other metal layers. The glass transition temperature and the Young's modulus of these layers may be different from each other, but the coefficient of thermal expansion (CTE) for each layer needs to be relatively the same as each other layer, especially for the metal layers in the laminate.

Figure 6:
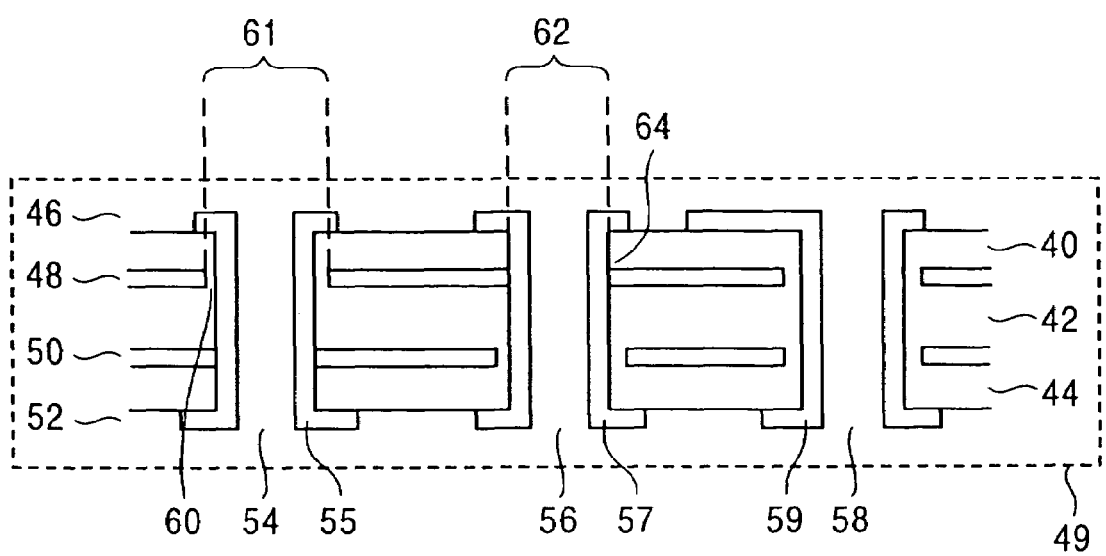
FIG. 6 is a cross section of an example substrate in current practice.

Referring to FIG. 6, an example PBGA substrate or laminate 49 illustrates the current practice for manufacturing the laminate, which comprises the dielectric layers 40, 42, and 44 and interspersed between the dielectric layers are the metal layers 46, 48, 50, and 52. The metal layers further comprise a signal layer 46, a voltage layer 48, a ground layer 50, and a signal layer 52. The dielectric layers 40, 42, and 44 all have the same relative stiffness to each other, the metal signal layers 46 and 52 have the same relative stiffness to each other (these layers typically comprise a surface area of 10% to 30% metal such as copper), and the metal voltage and ground layers 48 and 50 have the same relative stiffness to each other (these layers typically comprise a surface area of 75% to 85% metal). The means that the overall stiffness of the substrate 49 is basically symmetrical from top to bottom.

The typical laminate 49 further comprises the plated through holes (PTH) 54, 56, and 58 for conducting signals from an IC chip through the laminate 49 to a printed wiring board (see for example FIG. 1). An individual PTH may be formed by a mechanical drilling process or by a laser drilling process for example. After formation of the hole for the PTH, the hole is plated with a metal layer 55 for conducting the signals. PTH 54 is an example of a plated through hole coupled to the ground layer 50. PTH 56 is an example of a plated through hole coupled to the voltage layer 48. And, PTH 58 is an example of a plated through hole conducting a signal from the signal layer 46 to the signal layer 52.

When a PTH connects to a layer in the laminate, the metal plated layer of the PTH contacts the metal layer. For example in PTH 56, its metal plated layer 57 couples to the voltage layer 48 at point 64. The outer diameter 62 of PTH 56 (including the metal plated layer) is about 18 mils (thousandths of an inch) (where the inner diameter of the interior of PTH is typically 12 mils). When a PTH does not connect to a metal layer such as PTH 54 and metal layer 48, the diameter of the clearance hole 61 through the metal layer 48 is about 20 mils, which leaves a gap 60 of about 4 mils between the metal layer 48 and the metal plated layer 55 of PTH 54.

This embodiment of the present invention improves the reliability of flip chip package by controlling or varying the stiffness of the PBGA laminate by arranging the metal layers of the laminate accordingly so that the stiffest layer is towards the bottom of the laminate and the least stiff layer is towards the top of the laminate. The preferred embodiment of the present invention varies the stiffness of the voltage and ground layers (or the inner layers). For example with reference to FIG. 7, the relative stiffness of the layers would increase from the upper layer of the laminate comprising a metal layer 48 being stiff and a metal layer 50 being stiffer. Additionally, the top layer of the laminate (the layer that contacts the encapsulant), which could be a solder mask, should have a glass transition temperature near that of the encapsulant.

Controlling or varying the stiffness of the laminate is one technique to relocate the neutral plane of the laminate away from its mid-plane. As previously discussed, relocating the laminate's neutral plane away from the encapsulant allows one to reduce the CTE of the neutral plane of the encapsulant.

Figure 7:
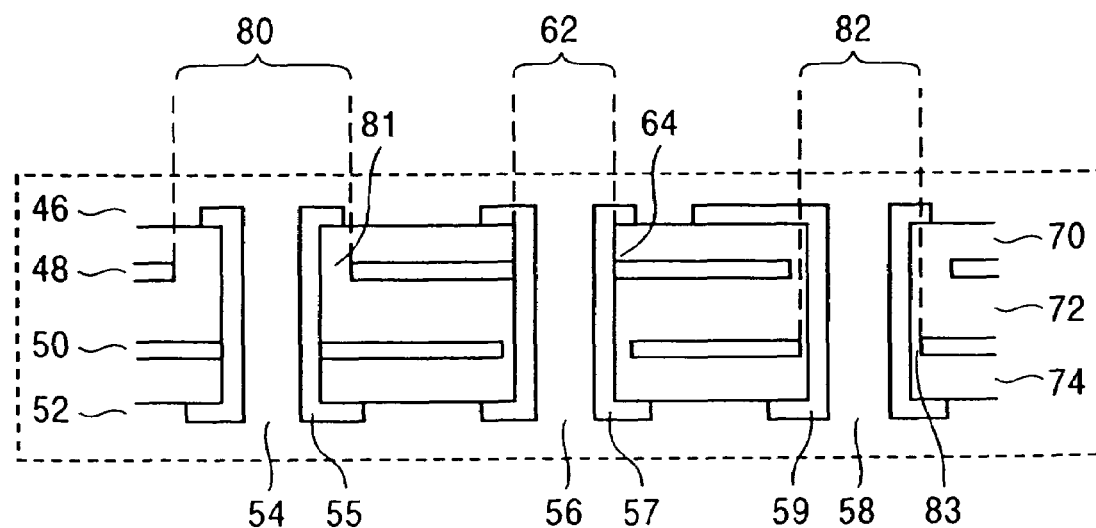
FIG. 7 illustrates an embodiment of the present invention for controlling the stiffness of a substrate.

Referring now to FIG. 7, one can control the stiffness of the metal layers, which typically comprise copper as the metal, by altering the diameter of the clearance holes within the layer. For example, increasing the diameter 80 of the clearance hole around PTH 54 to 30 mils on metal layer 48 reduces the stiffness of the layer. The reduction of stiffness occurs because there is less metal in the layer 48 (overall when compared to the prior method of making the substrate as in FIG. 6) and larger clearance holes around the PTHs. Together, these modifications combine to reduce the stiffness of a metal layer (or give the metal layer greater flexibility). In contrast to the larger clearance hole, the diameter 82 of the clearance hole around PTH 58 is about 18 mils (similar to the size of the prior method of making the clearance holes as illustrated by FIG. 6). By not changing the size of the clearance hole, the stiffness of layer 50 has not changed, although it is now greater than the stiffness of layer 48 due to the changes in layer 48. By reducing the stiffness of metal layer 48, it is now less stiff than metal layer 50. In other words, the order of relative stiffness of the metal layers is that metal layer 48 is stiff and metal layer 50 is stiffer.

Sacrificial Solder Balls

Another embodiment of the present invention that improves the reliability of a flip chip assembly helps reduce the stresses on the solder joint connections between a PBGA laminate and a PWB (Printed Wiring Board). Additionally, this embodiment helps reduce the bending or warpage of the IC chip. Bending or warpage of the IC chip may prevent the use or placement of a heatsink coupled to the top side of IC chip. Thermal performance of an IC chip is especially important when using high power IC chips that require a high capacity heat sink.

Figure 8A:
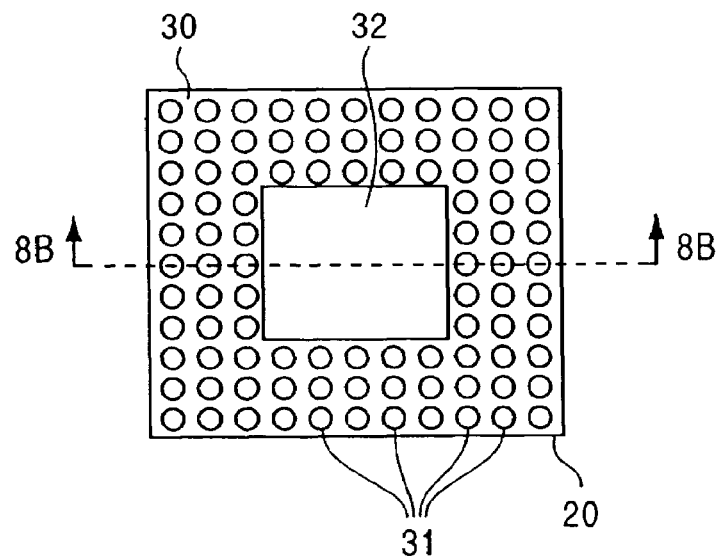
FIGS. 8A and 8B illustrate the current practice of locating solder balls on the bottom of a substrate.
Figure 8B:
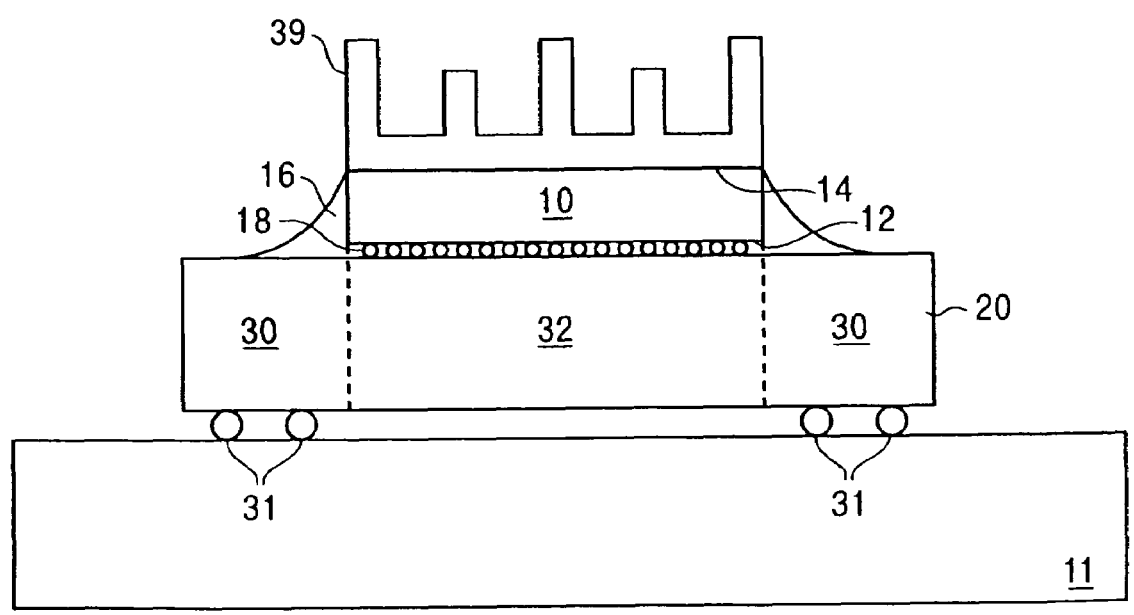

FIGS. 8A and 8B illustrate the current practice of locating solder joint connections on the bottom of a PBGA substrate for coupling the PBGA substrate to a PWB. FIG. 8A is a bottom view of the PBGA substrate 20. The substrate 20 typically has two distinct regions, the first region 32 is underneath the shadow of an IC chip 10, and the second region 30 is outside the IC chip shadow. The "shadow" of the IC chip comprises the area underneath the chip in other structures like the laminate.

FIG. 8B is a cross section of the flip chip package that illustrates the typical practice of locating the solder joint connections 31 between the PBGA substrate 20 and the PWB 11, which is to locate the solder balls 31 in the region outside of the chip shadow 30. With current flip chip packaging techniques, there is a tendency for the IC chip to bulge up or warp as previously discussed. This tendency for warpage places a mixture of shear stresses and bending stresses on the solder ball interconnections 31.

Figure 9A:
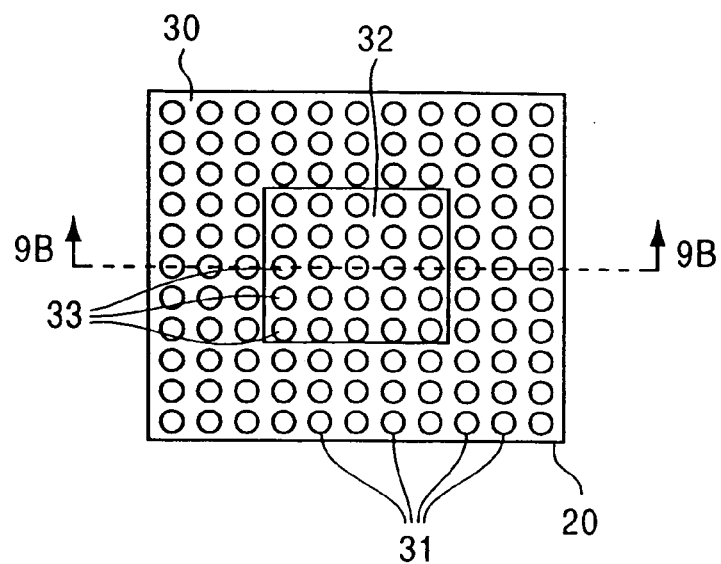
FIGS. 9A and 9B illustrate an embodiment of the present invention that uses additional solder balls on the bottom of a substrate.
Figure 9B:
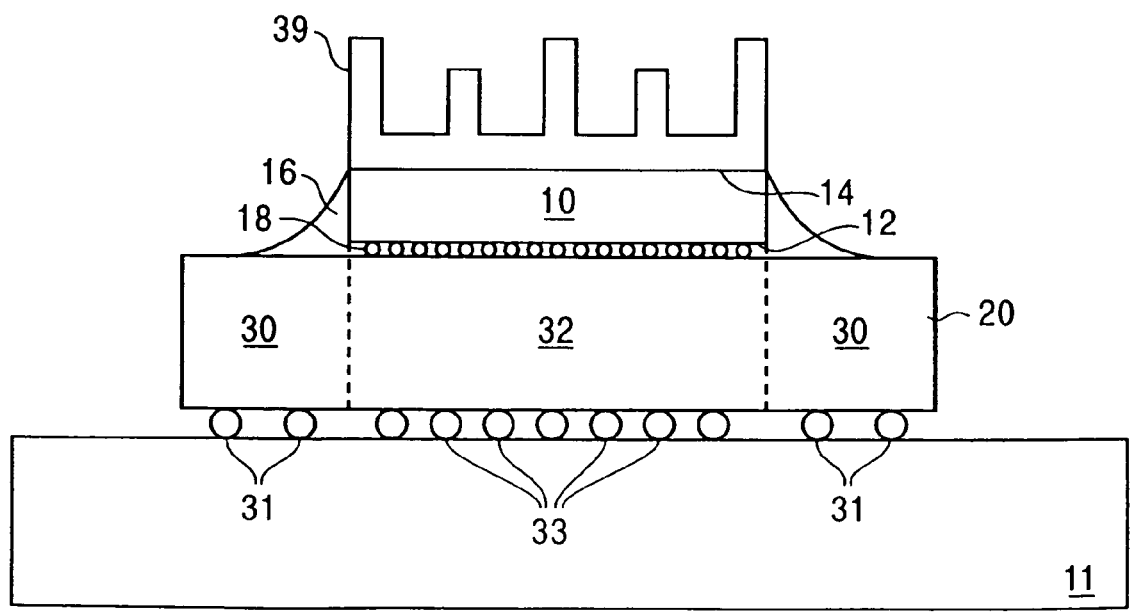

FIGS. 9A and 9B illustrate an embodiment of the present invention that reduces warpage or the bulging of the IC chip by using sacrificial or redundant solder joint connections by locating them in the shadow region of the IC chip. FIG. 9A is a bottom view of the PBGA substrate 22 with the shadow region 32 of the IC chip and the region 30 outside of the shadow of the IC chip. As in current practice, the solder joint connections 31 carry the signals including power and ground from the PWB through the PBGA laminate to the IC chip. This embodiment of the present invention, however, uses additional or redundant voltage and ground solder joint connections 33 located within the shadow region 32 of the IC chip.

FIG. 9B is a cross section view of FIG. 9A that better illustrates the shadow region 32 and region 30 outside of the shadow region as used in this embodiment of the present invention. The use of the additional solder ball connections 33 allows the mixture of shear stresses and bending stresses, which result from the bonding and encapsulation of the IC chip 10 to the laminate 20, to be spread over a larger number of solder joint connections (that now includes 31 and 33) to the PWB 11. The additional solder joint connections as a whole help reduce the shear and bending stress on each individual solder joint connection. Some of these "sacrificial" solder joint connections near the center of the shadow region 32 may eventually break, shear, or crack. This is not a concern, however, since the solder joint connections 32 within the shadow region are best utilized for "redundant" interconnections for voltage and ground between the PWB and the IC chip.

The present invention is a collection of techniques that overcome the above disadvantages and improve the overall reliability of the flip chip packaging technique. One may practice the different techniques of the present invention separately or in combination with one another. The present invention reduces the probability of an IC chip crack due to excessive stresses such as from warpage. Additionally, the present invention reduces the probability of an interfacial delamination between the IC chip and the encapsulant and or between the encapsulant and the substrate. And, the present invention also improves the reliability of the flip chip packaging technique in its daily uses (as part of a product) under repetitive thermal cycles of normal use.

The present invention discloses one embodiment that relocates the neutral planes in the PBGA laminate. This embodiment of the present invention reduces the compression strain on the device side of the IC chip and reduces the tensile strain on the back side of the IC chip that occurs when the encapsulated flip chip package assembly cools from its wiring board assembly temperature to room temperature.

Another embodiment of the present invention controls the stiffness of individual metal layers within the PBGA laminate with a reduction of stiffness from the bottom side to the top side of the laminate. This embodiment reduces warpage and the shear strain on the IC chip solder joints.

Another embodiment of the present invention uses redundant solder joint connections between the flip chip package and the printed wiring board. These additional solder joint connections help reduce the bending of the IC chip and help improve the placement of any heat sink on the back side of the IC chip. Reducing the bending of the IC chip also helps improve its thermal performance with a heatsink.

We claim:

1. A flip chip package comprising:
    an integrated circuit (IC) chip coupled to a first side of a package substrate; and
    sacrificial connections located at a second side of the package substrate in a shadow region of the IC chip to carry redundant signals, the shadow region including an area underneath the IC chip.

2. The flip chip package of claim 1 further comprising one or more redundant signal paths routed between said IC chip to said sacrificial connections through said package substrate.

3. The flip chip package of claim 1 wherein the sacrificial connections are spread over the shadow region.

4. The flip chip package of claim 1 wherein the redundant signals include at least one of power and ground signals.

5. A package comprising:
    a printed circuit board (PCB); and
    a flip chip package attached to the PCB, the flip chip package comprising:
        an integrated circuit (IC) chip coupled to a first side of a package substrate; and
        sacrificial connections located at a second side of the package substrate in a shadow region of the IC chip to carry redundant signals, the shadow region including an area underneath the IC chip.

6. The package of claim 5 wherein the flip chip package further comprises one or more redundant signal paths routed between said IC chip to said sacrificial connections through said package substrate.

7. The package of claim 5 wherein the sacrificial connections are spread over the shadow region.

8. The package of claim 5 wherein the redundant signals include at least one of power and ground signals.

9. A method comprising:
    coupling an integrated circuit (IC) chip to a first side of a package substrate; and
    locating sacrificial connections in a shadow region of the IC chip at a second side of the package substrate, the sacrificial connections carrying redundant signals, the shadow region including an area underneath the IC chip.

10. The method of claim 1 further comprising routing one or more redundant signal path between the IC chip to said sacrificial connections through the package substrate.

11. The method of claim 1 wherein locating the sacrificial connections comprises spreading the sacrificial connections over the shadow region.

12. The method of claim 1 wherein the redundant signals include at least one of power and ground signals.

13. A method comprising:
    providing a printed circuit board (PCB);
    attaching a flip chip package to the PCB via normal connections and sacrificial connections, the flip chip package including an integrated circuit (IC) chip coupled to top of a package substrate, the normal and sacrificial connections being coupled to bottom of the package substrate, the normal connections being outside a shadow region of the IC chip, the sacrificial connections being inside the shadow region and carrying redundant signals.

14. The method of claim 13 further comprising routing one or more redundant signal paths between the IC chip to the sacrificial connections through said package substrate.

15. The method of claim 13 wherein the sacrificial connections are spread over the shadow region.

16. The method of claim 13 wherein the redundant signals include at least one of power and ground signals.

* * * * *